(12) United States Patent
Kim (10) Patent No.: US 9,373,510 B1
(45) Date of Patent: Jun. 21, 2016

(54) METHOD FOR MANUFACTURING A SEMICONDUCTOR DEVICE

(71) Applicant: SK hynix Inc., Gyeonggi-do (KR)

(72) Inventor: Jong Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/879,926

(22) Filed: Oct. 9, 2015

(30) Foreign Application Priority Data

May 6, 2015 (KR) .................. 10-2015-0063237

(51) Int. Cl.
*H01L 21/425* (2006.01)
*H01L 21/266* (2006.01)
*H01L 27/115* (2006.01)

(52) U.S. Cl.
CPC ........ *H01L 21/266* (2013.01); *H01L 27/11556* (2013.01); *H01L 27/11582* (2013.01)

(58) Field of Classification Search
CPC ............ H01L 21/266; H01L 27/11556; H01L 27/11582
USPC .......................................... 438/531
See application file for complete search history.

(56) References Cited

U.S. PATENT DOCUMENTS

2010/0015746 A1* 1/2010 Park .................. H01L 27/14687 438/57
2010/0085812 A1* 4/2010 Kang .................. G11C 16/0483 365/185.17

FOREIGN PATENT DOCUMENTS

KR 1020120078958 7/2012
KR 1020130124714 11/2013

* cited by examiner

*Primary Examiner* — David S Blum
(74) *Attorney, Agent, or Firm* — IP & T Group LLP (57) ABSTRACT

Disclosed is a method for manufacturing a semiconductor device, including: forming a first material layer including holes exposing a part of an ion injection target layer on the ion injection target layer; forming gap filling layers having a smaller height than that of the holes inside the holes; forming a second material layer on the gap filling layers and the first material layer; forming ion injection mask patterns exposing the gap filling layer by removing the second material layer formed on the gap filling layer in the second material layer; exposing a part of the ion injection target layer through inner portions of the holes by removing the exposed gap filling layer; and performing an ion injection process on the exposed ion injection target layer.

17 Claims, 10 Drawing Sheets

METHOD FOR MANUFACTURING A SEMICONDUCTOR DEVICE

CROSS-REFERENCE TO RELATED APPLICATION

The present application claims priority to Korean patent Application number 10-2015-0063237, filed on May 6, 2015, the entire disclosure of which is herein incorporated by reference in its entirety.

BACKGROUND

1. Field

The present disclosure relates to a method for manufacturing a semiconductor device, and more particularly, to a method of manufacturing an ion injection mask.

2. Discussion of Related Art

A semiconductor device may include a memory cell array including a plurality of memory cells, a peripheral circuit configured to perform a program operation, a read operation, and an erase operation of the memory cells, and a control circuit configured to control the peripheral circuit.

Since the plurality of memory cells is included in the memory cell array, the memory cell array occupies a large area of the semiconductor device. In order to increase a data storage capacity of the semiconductor device, an area of the memory cell array is gradually increased. However, to suppress an increase in an area of the memory cell array and increase a data storage capacity, a memory cell array having a 3D structure has been developed.

The memory cell array having a 3D structure includes memory blocks having a 3D structure, and each of the memory blocks having the 3D structure includes strings having a 3D structure. The strings having the 3D structure include a plurality of memory cells stacked on a substrate in a vertical direction, and include a plurality of word lines connected to the memory cells, respectively, and stacked in the vertical direction.

AS described above, when the strings are formed in a 3D structure, heights of the strings are increased. When the heights of the strings are increased, it may be difficult to form a hole or a trench having a large depth during a manufacturing process.

Particularly, during an ion injection process for forming a junction in an ion injection target layer exposed at a lower side of the hole having a large depth, it is necessary to form ion injection mask patterns. However, foreign substances generated during a manufacturing process may not be completely removed and left at the lower portion of the deep hole. The foreign substances may cause a defective junction so that yield of the manufacturing process may deteriorate. As a result, reliability of the semiconductor device may also deteriorate.

SUMMARY

The present disclosure provides a method for manufacturing a semiconductor device, which is capable of preventing foreign substances from being left on an ion injection target layer when an ion injection mask pattern is formed.

An exemplary embodiment of the present disclosure provides a method for manufacturing a semiconductor device, including: forming a first material layer including holes exposing a part of an ion injection target layer on the ion injection target layer; forming gap filling layers having a smaller height than that of the holes inside the holes; forming a second material layer on the gap filling layers and the first material layer; forming ion injection mask patterns exposing the gap filling layer by removing the second material layer formed on the gap filling layer in the second material layer; exposing a part of the ion injection target layer through inner portions of the holes by removing the exposed gap filling layer; and performing an ion injection process on the exposed ion injection target layer.

Another exemplary embodiment of the present disclosure provides a method for manufacturing a semiconductor device, including: forming a first material layer on a substrate; forming holes having a first height by etching a part of the first material layer; forming gap filling layers having a second height smaller than the first height inside the holes; forming a photoresist layer on the gap filling layer and the first material layer; exposing the gap filling layers by removing the photoresist layer formed on the gap filling layers in the photoresist layer; exposing a part of the substrate through inner portions of the holes by removing the exposed gap filling layers; and performing an ion injection process on the exposed substrate by using the photoresist layer, which is left on the first material layer, as an ion injection mask pattern.

According to the exemplary embodiments, it is possible to suppress generation of defective junction by preventing foreign substances from being left on an ion injection target layer when an ion injection mask pattern is formed. It is possible to improve reliability of an ion injection process. Accordingly, it is possible to improve yield and reliability of a semiconductor device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Hereinafter, an exemplary embodiment of the present disclosure will be described in detail with reference to the accompanying drawings. However, the present disclosure is not limited to embodiments to be disclosed below, but various forms different from each other may be implemented. However, the embodiments are provided to be completely known to those skilled in the art.

FIGS. 1 to 7 are cross-sectional views illustrating a method for manufacturing a semiconductor device according to an exemplary embodiment of the present disclosure.

Figure 1:
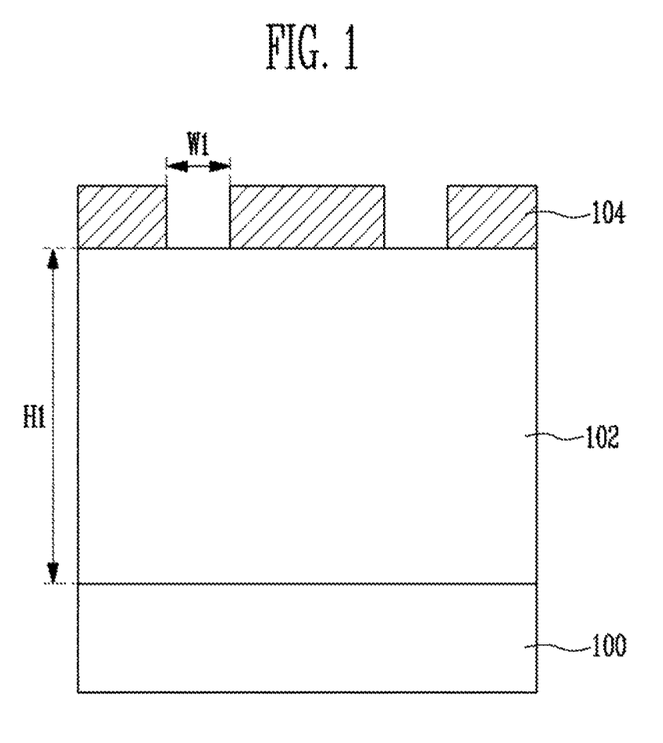
FIGS. 1 to 7 are cross-sectional views illustrating a method for manufacturing a semiconductor device according to an exemplary embodiment of the present disclosure.

Referring to FIG. 1, a first material layer 102 is formed on a substrate 100. The first material layer 102 may be formed of a material which is not etched by a developing agent and deionized water. The first material layer 102 may be formed with a first height H1. The first height H1 of the first material layer 102 is the same as a thickness of the first material layer 102. For example, the first height H1 may be 5,000 angstrom (Å)~6,000 angstrom (Å), and may be larger or smaller than 5,000 angstrom (Å)~6,000 angstrom (Å).

Etching mask patterns 104 are formed on the first material layer 102. The etching mask patterns 104 may have a plurality of openings exposing a part of the first material layer 102. The plurality of openings may be formed in a circular shape or a line shape having a first width W1.

Figure 2:
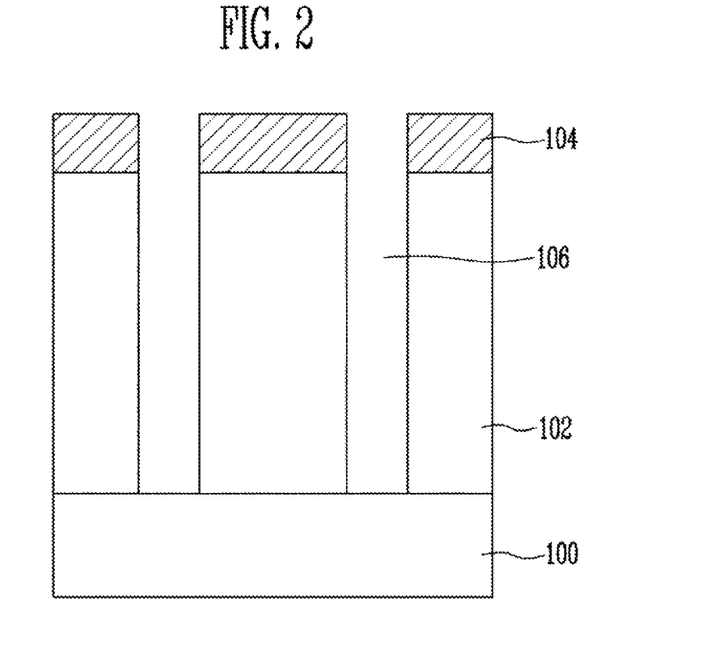

Referring to FIG. 2, a plurality of holes or trenches 106 is formed inside the first material layer 102 by performing an etching process for removing the first material layer 102 exposed through the openings of the etching mask patterns 104. The etching process may be performed by a dry etching process and is performed so that a part of the substrate 100, to which ions will be injected, is exposed through lower portions of the plurality of holes 106.

Figure 3:
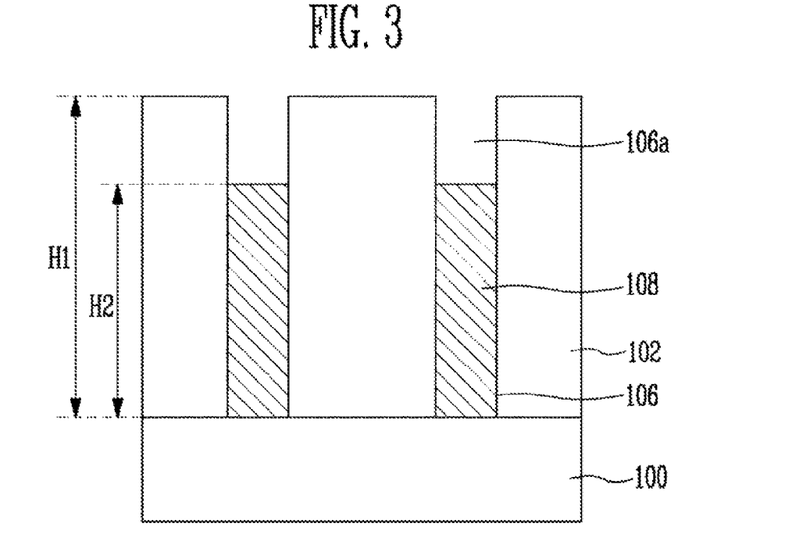

Referring to FIG. 3, gap filling layers 108 are formed inside the holes 106. The gap filling layers 108 are formed of a water soluble material, and may include a fluent material removable by a developing agent or deionized water. For example, the gap filling layers 108 may be formed by a method below.

The gap filling layers 108 are coated inside the holes 106. The holes 106 may be filled with the gap filling layer 108 from its lower portion of according to a characteristic of a fluent material. The gap filling layer 108 may be formed to have a second height H2 smaller than the first height H1 of the first material layer 102. For example, the second height H2 may be 7/10 to 8/10 times that of the first height H1. However, the second height H2 is not limited thereto. The inner sides of the holes 108 are not completely filled with the gap filling layers 108 so that a part of upper portions 106a of the holes 106 are exposed on the gap filling layers 108. After the gap filling layers 108 are coated, a baking process for solidifying the fluent gap filling layers 108 is performed. The baking process is performed at a high temperature so that the gap filling layers 108 are solidified. Then, a cooling process for decreasing a temperature of an entire structure including the gap filling layers 108 may be further performed.

Figure 4:
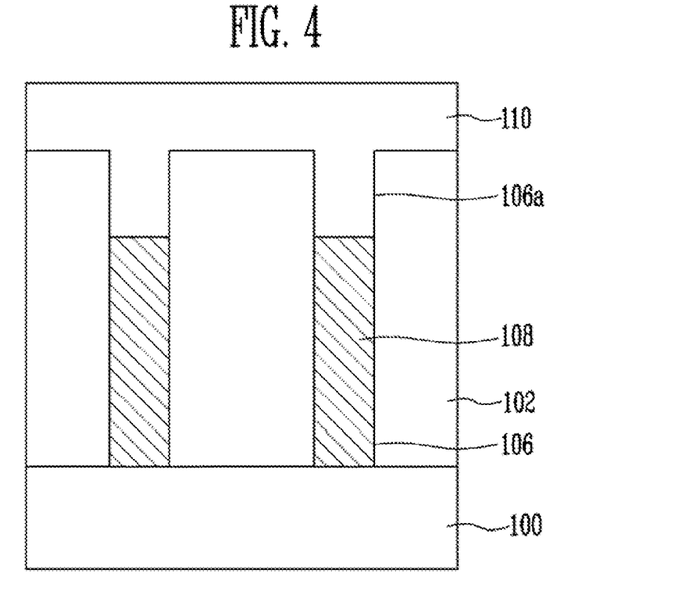

Referring to FIG. 4, a second material layer 110 serving as an ion injection mask pattern is formed on the first material layer 102 and the gap filling layers 108 so that the upper portions 106a of the holes 106 exposed on the gap filling layers 108 are filled. The second material layer 110 may be a negative type or positive type photoresist layer.

Figure 5:
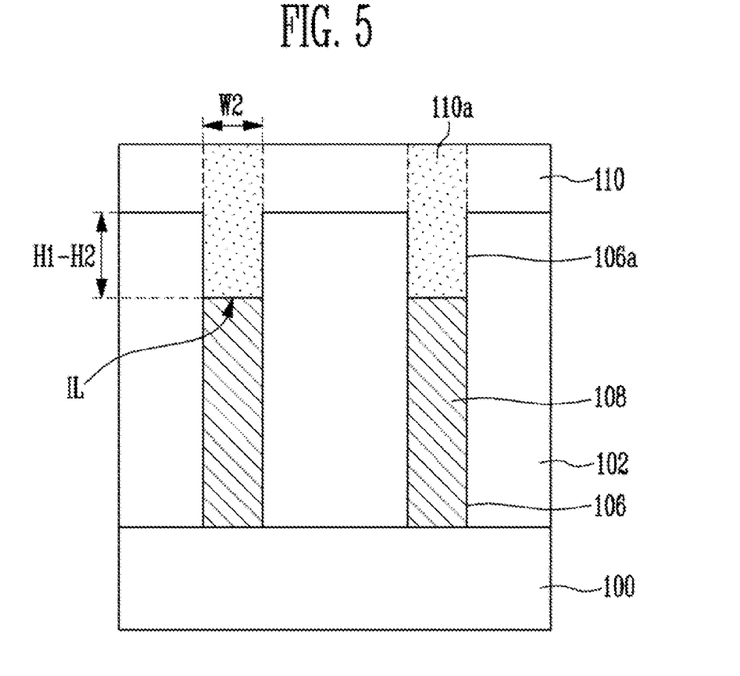

Referring to FIG. 5, an exposure process is performed on a part of the second material layer 110. When the second material layer 110 is the negative type photoresist layer, upon completion of the exposure process, a part of the second material layer 110 to which light is irradiated will remain. When the second material layer 110 is the positive type photoresist layer, upon completion of the exposure process, a part of the second material layer 110 to which light is irradiated will be removed.

Hereinafter, a case in which the positive type photoresist layer is used as the second material layer 110 will be described as an example.

A part of the second material layer 110 is transformed to a third material layer 110a by irradiating a light source to the second material layer 110 formed on the gap filling layers 108. The third material layer 110a may be formed with a second width W2 that is the same as the width of the holes 106, or a width larger than the second width W2. Particularly, the lower portions of the holes 106 are filled with the gap filling layers 108 so that it is easy to irradiate a light source for transforming the part of the second material layer 110 into the third material layer 110a.

That is, a depth of the second material layer 110, to which the light source is irradiated, is a sum of the height of the second material layer 110 formed on the first material layer 102 and a height corresponding to a difference between the first height H1 and the second height H2. Thus, the depth of the second material layer 110, to which the light source needs to be irradiated, is shallower than bottoms of the holes 106. That is, it is enough to irradiate the light source only to a portion IL, at which the second material layer 110 is in contact with the gap filling layer 108, so that the light source may be evenly irradiated. Thus, the third material layer 110a may be evenly formed from an upper surface to a lower surface.

Figure 6:
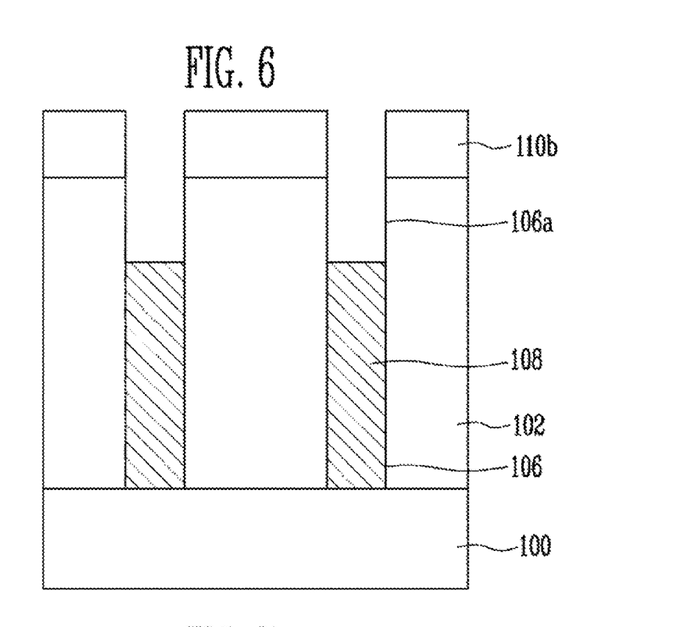

Referring to FIG. 6, the developing process for removing the third material layer 110a is performed. After the third material layer 110a is removed, the patterns of the second material layer 110 left on the first material layer 102 may serve as ion injection mask patterns 110b. Particularly, a depth of the third material layer 110a to be removed is not large, so that it is possible to easily perform the developing process so that foreign substances of the third material layer 110a are prevented from being left on the gap filling layers 108. The developing process may be performed by using a developing agent. When the third material layer 110a is removed by the developing agent, a part of the gap filling layer 108 under the third material layer 110a may also be removed.

Figure 7:
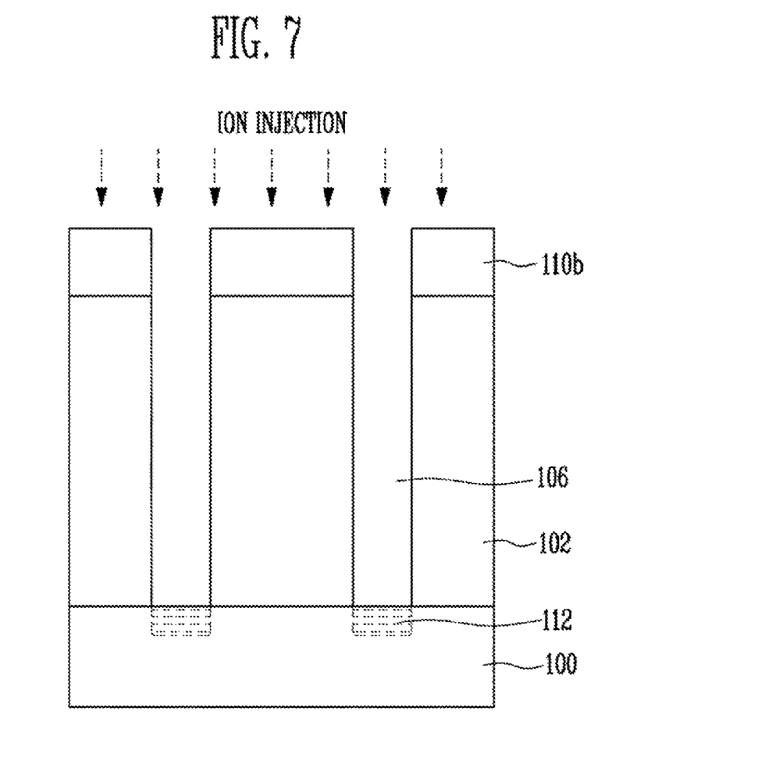

Referring to FIG. 7, a part of the substrate 100 is exposed through the holes 106 by removing the gap filling layers 108 left inside the holes 106. The etching process for removing the gap filling layer 108 may be performed by a wet etching process using an etchant. The first material layer 102 is not etched by the etchant, but the gap filling layer 108 is etched by the etchant.

In another embodiment, another etchant may be used. An etching speed of the gap filling layer 108 by the etchant is larger than that of the first material layer 102. For example, a developing agent or deionized water may be used as the etchant. Particularly, the gap filling layer 108 is easily removed by a developing agent or deionized water, so that it is possible to prevent foreign substances from being left inside the holes 106.

Next, a junction 112 is formed on the substrate 110 exposed through the holes 106 by performing an ion injection process on the entire structure including the ion injection mask patterns 110b. As described above, when the ion injection mask patterns 110b are formed, the foreign substances are prevented from being left inside the holes 106. Thus, it is possible to easily form the junction 112. A chance that formation of the junction 112 fails may decrease. Thus, it is possible to improve reliability of the ion injection process and improve yield and reliability of the semiconductor device.

The aforementioned manufacturing method may be applied to a device, in which a depth of the holes 106 exposing the ion injection target layer is large. The manufacturing method is applicable to a process of manufacturing a memory block having a three-dimensional (3D) structure. A memory block having a 3D structure will be described in detail.

Figure 8:
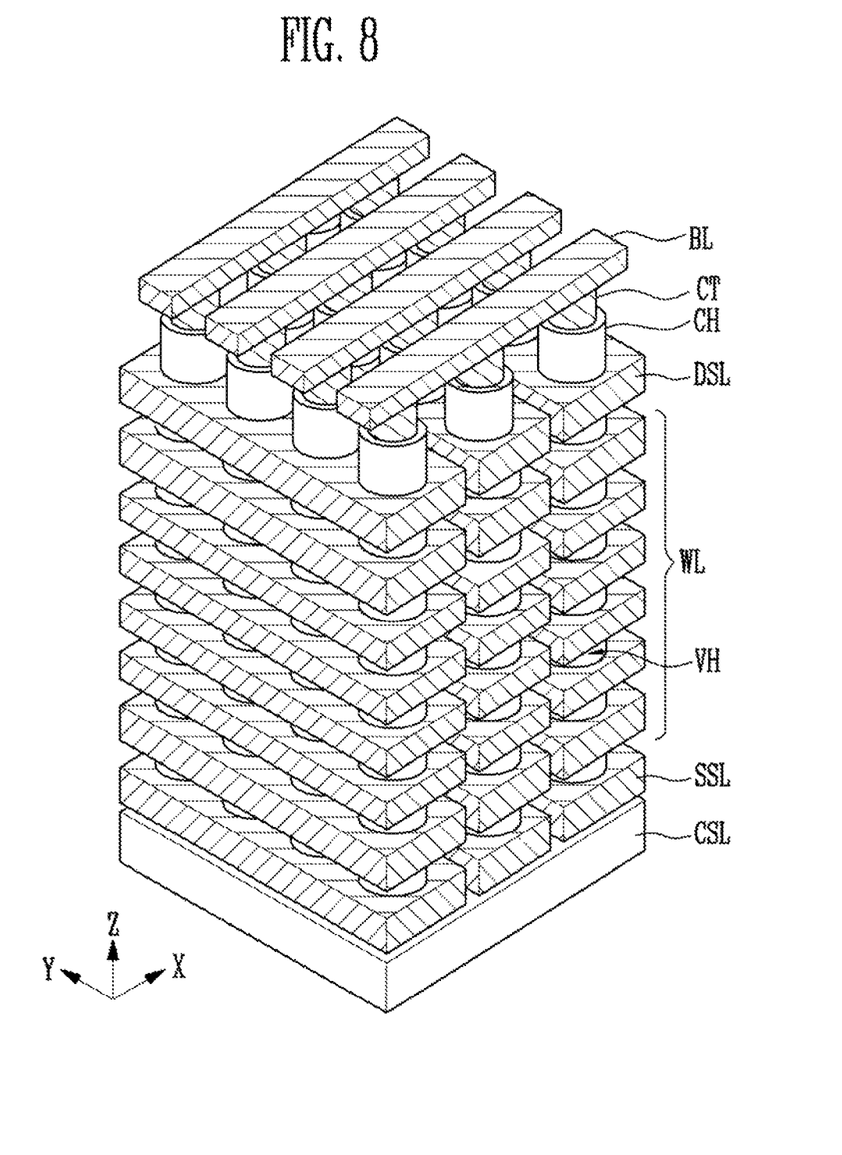
FIGS. 8 and 9 are perspective views illustrating a memory block having a three-dimensional structure.
Figure 9:
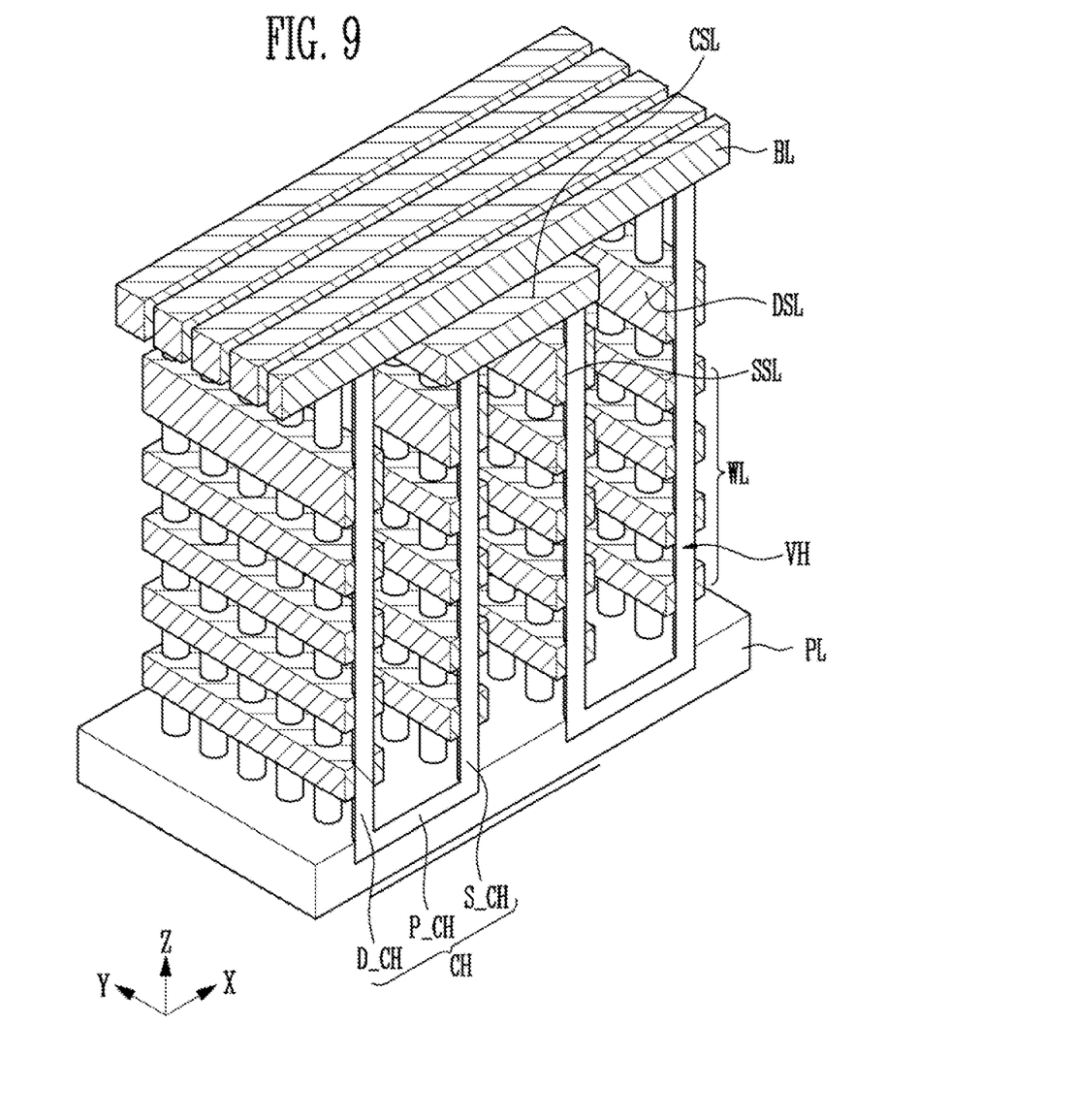

FIGS. 8 and 9 are perspective views illustrating a memory block having a 3D structure. FIG. 8 is a perspective view of a memory block including I-shaped strings, and FIG. 9 is a perspective view of a memory block including U-shaped strings.

Referring to FIG. 8, a memory block having a 3D structure may include strings having an I-shaped 3D structure. The strings having the 3D structure may be vertically arranged between bit lines BL and a common source line CSL. The structure is also called Bit Cost Scalable (BICS). For example, when the common source line CSL is horizontally formed on a substrate, the strings having the BiCS structure may be formed in a direction vertical to an upper portion of the common source line CSL that is a Z-direction.

More particularly, the strings include source lines SSL, word lines WL, and drain select lines DSL each of which is arranged in a first direction that is, a X-direction. The source lines SSL, the word lines WL, and the drain select lines DSL are vertically stacked in the Z direction and spaced from each other. Vertical channel layers CH vertically passing through the source lines SSL, the word lines WL, and the drain select lines DSL are in contact with the common source line CSL. The bit lines extended in the first direction or X-direction are in contact with upper portions of the vertical channel layers CH protruding from upper portions of the drain select lines DSL, and are arranged in a second direction that is, a Y-direction orthogonal to the first direction or X-direction. A contact plug CT may be further formed between the bit lines BL and the vertical channel layers CH.

Referring to FIG. 9, a memory block having a three-dimensional structure may include strings having a U-shaped three-dimensional structure. The strings having the three-dimensional structure may be formed in a structure, in which first sub strings vertically arranged between bit lines BL and a pipe line PL, and second sub strings vertically arranged between a common source line CSL and the pipe line PL are connected with each other within a region of the pipe line PL. The structure is also called a Pipe-shaped Bit Cost Scalable (P-BiCS).

For example, when the pipe line PL is horizontally formed on a substrate, the strings having the P-BiCS structure include the first sub strings formed in a direction vertical to an upper portion of the pipe line PL that is, a Z-direction, and arranged between the bit lines BL and the pipe line PL, and the second sub strings formed in a direction vertical to the upper portion of the pipe line PL and arranged between the common source lines CSL and the pipe line PL.

More particularly, the first sub strings include word lines WL, drain select lines DSL, and vertical channel layers. Each of the word lines WL and the drain select lines DSL are arranged in the first direction or X-direction. The word lines WL and the drain select lines DSL are stacked and spaced from each other. The first vertical channel layers D_CH vertically pass through the word lines WL and the drain select lines DSL.

The second sub strings include word lines WL, source select lines SSL, and second vertical channel layers S_CH. Each of the word lines WL and the source select lines SSL are arranged in the first direction or X-direction. The word lines WL and the source select lines SSL are stacked and spaced from each other. The second vertical channel layers S_CH vertically pass through the word lines WL and the source select lines SSL.

The first vertical channel layers D_CH and the second vertical channel layers S_CH are connected to each other by the pipe channel layers P_CH within the pipe line PL. The bit lines BL extended in the first direction or X-direction are in contact with upper portions of the first vertical channel layers D_CH protruding from upper portions of the drain select lines DSL. The bit lines BL are arranged in the second direction or Y-direction orthogonal to the first direction or X-direction.

As described with reference to FIGS. 8 and 9, the plurality of lines including the word lines is stacked in the vertical direction in the memory blocks having the 3D structure, so that heights of the memory blocks having the 3D structure are gradually increased. As described above, the ion injection mask patterns may be formed and the ion injection process may be performed on the memory block having a large height or peripheral circuits, by the aforementioned method. This will be described in detail based on a cross-section taken along the first direction or X-direction as an example.

FIGS. 10 to 16 are cross-sectional views illustrating a method for manufacturing a semiconductor device according to another exemplary embodiment of the present disclosure.

Figure 10:
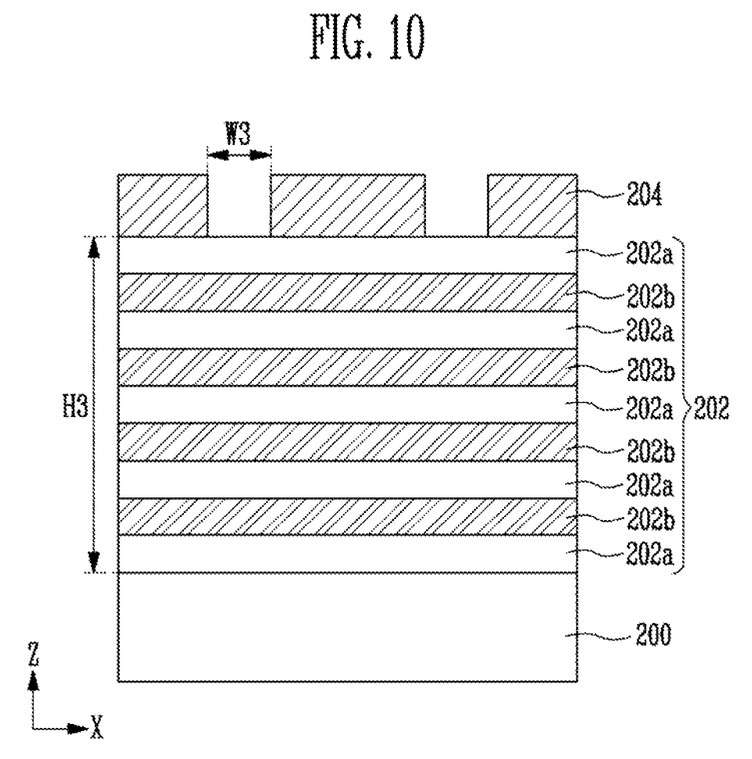
FIGS. 10 to 16 are cross-sectional views illustrating a method for manufacturing a semiconductor device according to another exemplary embodiment of the present disclosure.

Referring to FIG. 10, stacked layers 202 are illustrated, in which fourth material layers 202 and fifth material layers 202b are alternatively stacked on an ion injection target layer 200. The ion injection target layer 200 may be a substrate. The fourth and fifth material layers 202a and 202b may be formed of a material which is not etched by a developing agent and deionized water. For example, the fourth material layers 202a may be insulating layers. The fifth material layers 202b may be conductive layers serving as word lines or sacrificial layers (for example, nitride layers). The sacrificial layers may be formed before the word lines are formed.

The stacked layers 202 may have a third height H3. The third height H3 of the stacked layers 202 may be the same as a thickness of the stacked layers 202. For example, the third height H3 may be 5,000~6,000 angstrom (Å), and may be larger or smaller than 5,000~6,000 angstrom (Å).

Etching mask patterns 204 are formed on the stacked layers 202. The etching mask patterns 204 may have a plurality of openings exposing a part of the stacked material layers 202. The plurality of openings may be formed in a circular shape or a line shape having a third width W3.

Figure 11:
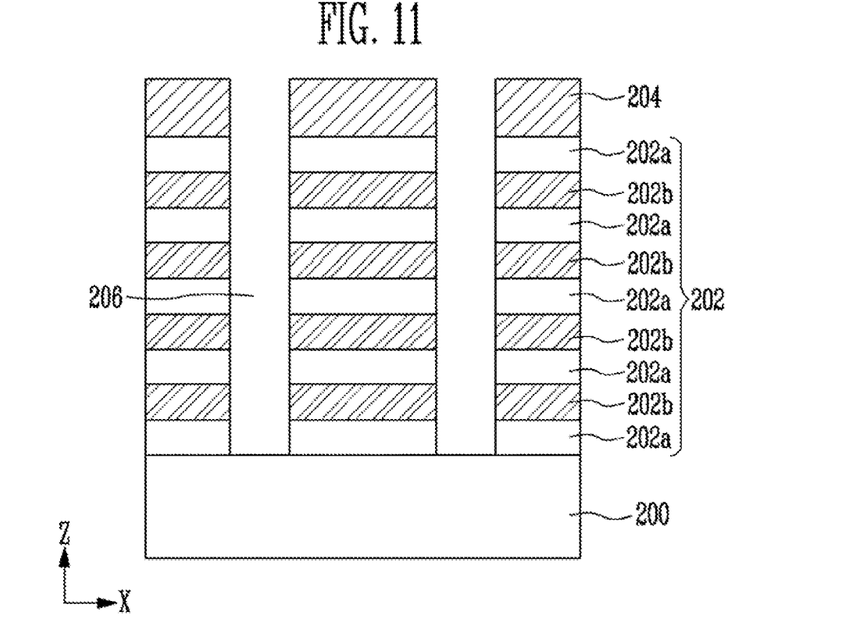

Referring to FIG. 11, a plurality of holes or trenches 206 is formed inside the stacked layers 202 by performing an etching process for removing the stacked materials 202 exposed through the openings of the etching mask patterns 204. The etching process may be performed by a dry etching process, and is performed so that a surface, in which ions are to be injected, is exposed through lower portions of the plurality of holes 206. For example, the etching process may be performed so that a part of the ion injection target layer 200 under the holes 206 is exposed.

Figure 12:
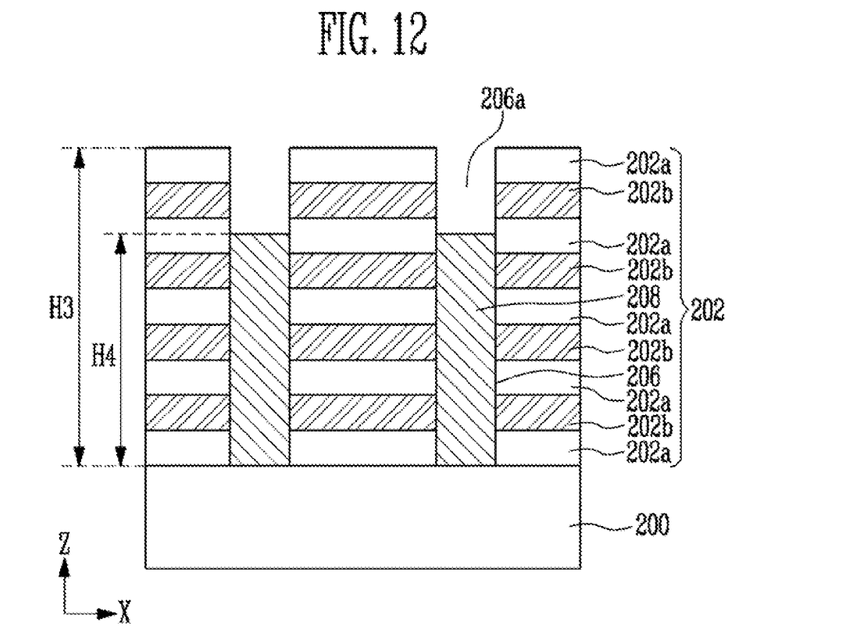

Referring to FIG. 12, gap filling layers 208 are formed inside the holes 206. The gap filling layers 208 are formed of a water soluble material and may include a fluent material which is removable by a developing agent or deionized water. For example, the gap filling layers 208 may be formed as described below.

The gap filling layers 208 are coated on an entire structure including the holes 206. The holes 206 may be filled with the gap filling layer 208 which has a characteristic of a fluent material. The gap filling layer 208 may be formed to have a fourth height H4 smaller than the third height H3 of the stacked layers 202 inside the holes 206. For example, the fourth height H4 may be 7/10 to 8/10 times that of the third height H3. However, the fourth height H4 is not limited thereto.

Inner sides of the holes 208 are not completely filled with the gap filling layers 208, so that a part of upper portions 206a of the holes 206 are exposed on the gap filling layers 208. After the gap filling layers 208 are coated, a baking process for solidifying the fluent gap filling layers 208 is performed. The baking process is performed at a high temperature, so that when the gap filling layers 208 are solidified, a cooling process for lowering a temperature of an entire structure including the gap filling layers 208 may be further performed.

Figure 13:
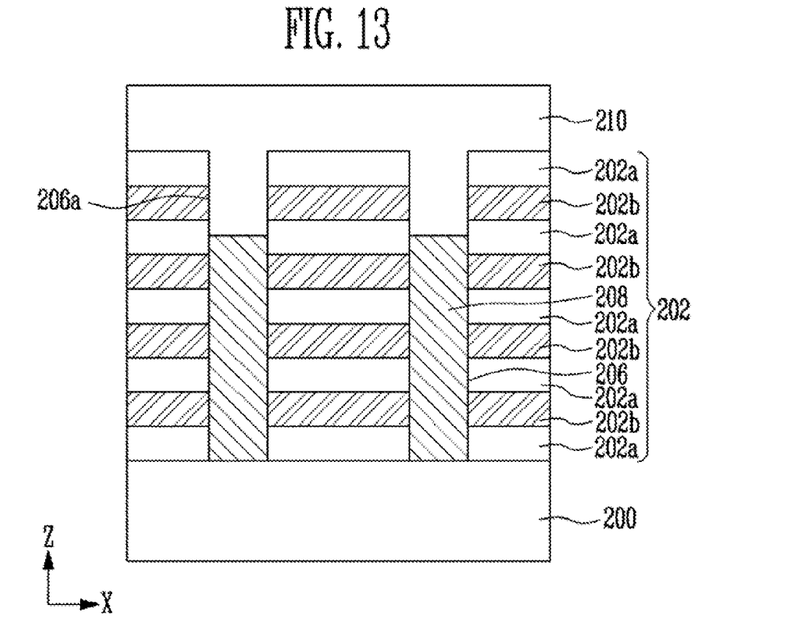

Referring to FIG. 13, a sixth material layer 210 for an ion injection mask pattern is formed on the stacked layers 202 and the gap filling layers 208 so that the upper portions 206a of the holes 206 exposed on the gap filling layers 208 are filled. The sixth material layer 210 may be a negative type or positive type photoresist layer.

Figure 14:
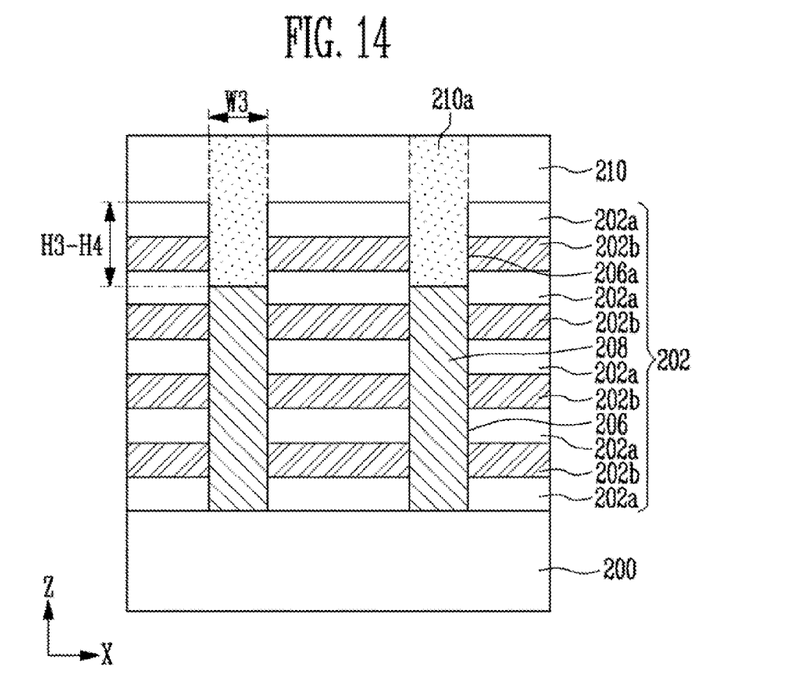

Referring to FIG. 14, an exposure process is performed on a part of the sixth material layer 210. When the sixth material layer 210 is the negative type photoresist layer, the exposure process is performed by irradiating a light source to a part of the sixth material layer 210 which is to be left. When the sixth material layer 210 is the positive type photoresist layer, the exposure process is performed by irradiating a light source to a part of the sixth material layer 210 which is to be removed. In an embodiment which will be described hereinafter, the positive type photoresist layer is used as the sixth material layer 210.

A part of the sixth material layer 210 is transformed to a seventh material layer 210a by irradiating a light source to the sixth material layer 210 formed on the gap filling layers 208. The seventh material layer 210a may be formed with a third width W3 that is the same as that of the holes 206, or a width larger than the third width W3. Particularly, the lower portions of the holes 208 are filled with the sixth material layers 210 so that it is easy for completely and uniformly transforming the part of the sixth material layer 210 into the seventh material layer 210a.

That is, a depth of the seventh material layer 210a is the same as a sum of (i) the height or the depth of the sixth material layer 210 formed on the stacked layers 202 and (ii) a difference between the third height H3 and the fourth height H4. A bottom of the seventh material layer 210a is located at a higher level than bottoms of the holes 206.

That is, since the sixth material layer 210 is in contact with the gap filling layer 208 and is formed to a relatively shallower depth, the light source may be evenly irradiated so that it is easy to transform the sixth material layer 210 into the seventh material layer 210a. Thus, the seventh material layer 210a may be formed in a uniform manner from its top surface to its bottom surface. The seventh material layer 210a will be removed during a subsequent developing process.

Figure 15:
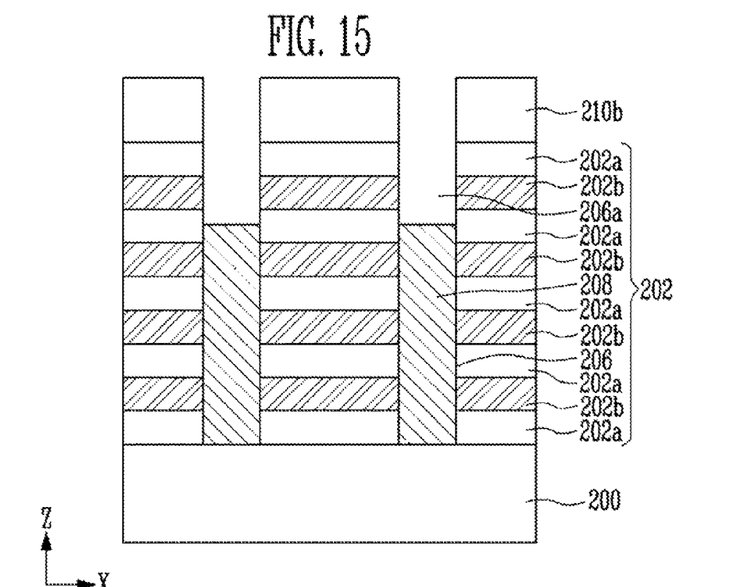

Referring to FIG. 15, the developing process for removing the seventh material layer 210a is performed. As a result, the remaining sixth material layer 210 is patterned as ion injection mask patterns 110b. Since the depth of the seventh material layer 210a is not large, it is easy to prevent foreign substances from being introduced while the seventh material layer 210a is removed by a developing process. The developing process may be performed by using a developing agent. When the seventh material layer 210a is removed by the developing agent, a part of the gap filling layer 208 under the seventh material layer 210a may be removed as well.

Figure 16:
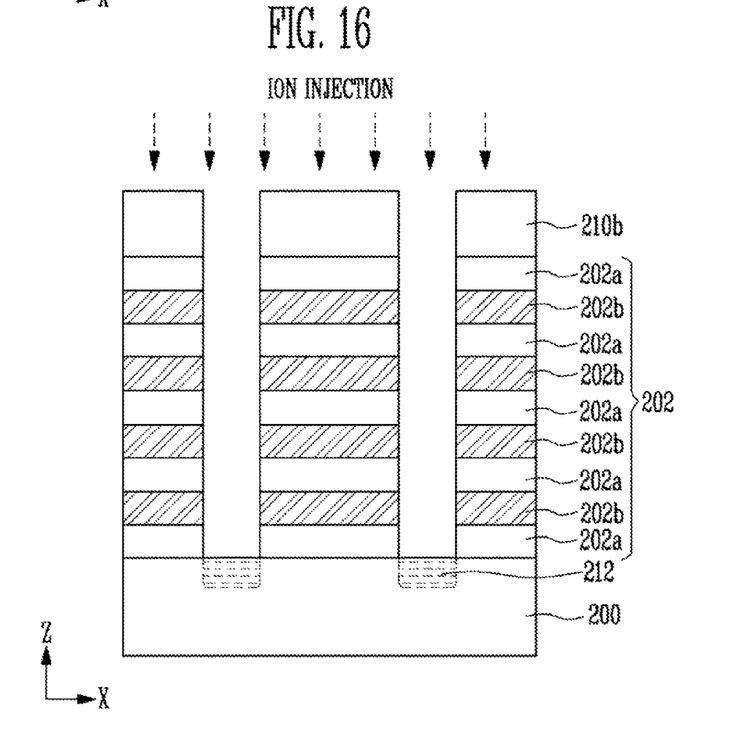

Referring to FIG. 16, the gap filling layers 208 are selectively etched to expose part of the ion injection target layer 200. The etching process for removing the gap filling layer 208 may be performed by a wet etching process using an etchant.

The etchant may not etch the stacked layers 202 while etching the gap filling layer 208. In another embodiment, an etchant which has a higher etching speed against the gap filling layer 208 than that of the stacked layers 202 may be used. For example, a developing agent or deionized water may be used as the etchant. The gap filling layer 208 is easily removed by a developing agent or deionized water, so that it is possible to prevent foreign substances from being left inside the holes 206.

Next, a junction 212 is formed on the ion injection target layer 200 exposed by the holes 206. The junction 212 is formed by performing an ion injection process on the entire structure including the ion injection mask patterns 210b.

As described above, when the ion injection mask patterns 210b are formed, the foreign substances are prevented from being introduced into the holes 206. Thus, it is possible to easily form the junction 212.

Further, when the ion injection mask patterns 210b are formed in a high region similar to the semiconductor device having the 3D structure, it is possible to easily form the junction 202. Particularly, a frequency of failure generation of the junction 212 may be decreased, so that it is possible to improve reliability of the ion injection process and improve yield and reliability of the semiconductor device.

As described above, the embodiment has been disclosed in the drawings and the specification. The specific terms used herein are for purposes of illustration and do not limit the scope of the present disclosure defined in the claims. Accordingly, those skilled in the art will appreciate that various modifications and other equivalent examples may be made without departing from the scope and spirit of the present disclosure. Therefore, the sole technical protection scope of the present disclosure will be defined by the technical spirit of the accompanying claims.

What is claimed is:

1. A method for manufacturing a semiconductor device, comprising:
   forming a first material layer over an ion injection target layer, wherein the first material layer includes holes, wherein each of the holes exposes a part of the ion injection target layer;
   forming gap filling layers in the holes, wherein a top of each of the gap filling layers is located at a lower level than a top of the first material layer;
   forming a second material layer over the gap filling layers and the first material layer;
   removing the second material layer formed over the gap filling layers to form ion injection mask patterns, wherein each of the ion injection mask patterns exposes each of the gap filling layers;
   removing the exposed gap filling layers to expose the ion injection target layer; and
   performing an ion injection process into the exposed ion injection target layer to form junctions.

2. The method of claim 1, wherein the first material layer includes a plurality of different material layers, and
   wherein plurality of different material layers are alternately stacked to each other.

3. The method of claim 1, wherein the gap filling layer includes a water soluble material.

4. The method of claim 1, wherein the gap filling layer includes a fluent material which is removable by a developing agent or deionized water.

5. The method of claim 1, wherein the forming of the gap filling layers includes:
   forming the gap filling layers in the holes, respectively, in a recessed manner; and
   performing a baking process to solidify the gap filling layers.

6. The method of claim 1, wherein each of the gap filling layers has a length of 7/10 to 8/10 of a depth of each of the holes.

7. The method of claim 5, further comprising:
   performing a cooling process for decreasing a temperature of an entire structure including the gap filling layers after performing the baking process.

8. The method of claim 1, wherein the second material layer includes a photoresist layer.

9. The method of claim 1, wherein the removing of the second material layer includes:
   irradiating a light source on the second material layer to transform the second material layer into a third material layer; and
   performing a developing process to expose the gap filling layers by removing the third material layer.

10. The method of claim 9, wherein the developing process is performed using a development agent.

11. The method of claim 1, wherein removing of the exposed gap filling layers is performed by a wet etching process.

12. The method of claim 11, wherein the wet etching process is performed by using a developing agent or deionized water as an etchant.

13. A method for manufacturing a semiconductor device, comprising:
   forming a first material layer over a substrate;
   forming holes by etching a part of the first material layer;
   forming gap filling layers in lower portions of the holes;
   forming a photoresist layer over the gap filling layers and the first material layer;
   removing the photoresist layer formed over the gap filling layers to expose the gap filling layers;
   removing the exposed gap filling layers to expose the substrate; and
   performing an ion injection process into the exposed substrate using the photoresist layer as an ion injection mask pattern.

14. The method of claim 13, wherein the removing of the photoresist layer formed over the gap filling layers includes:
   performing an exposure and developing process.

15. The method of claim 14, further comprising:
   simultaneously removing the exposed gap filling layers when the photoresist layer formed over the gap filling layers are removed.

16. The method of claim 13, wherein the removing of the exposed gap filling layers is performed by a wet etching process.

17. The method of claim 16, wherein the wet etching process is performed using an etchant which etches the gap filling layers faster than the first material layer.

* * * * *